(12) United States Patent
Lin et al.

(10) Patent No.: US 9,251,911 B2
(45) Date of Patent: Feb. 2, 2016

(54) SHIFT REGISTER CIRCUIT

(71) Applicant: AU Optronics Corp., Hsin-Chu (TW)

(72) Inventors: Wei-Li Lin, Hsin-Chu (TW);
Chun-Hsin Liu, Hsin-Chu (TW);
Chia-Heng Chen, Hsin-Chu (TW);
Shu-Fang Hou, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 165 days.

(21) Appl. No.: 14/184,779

(22) Filed: Feb. 20, 2014

(65) Prior Publication Data

US 2015/0049853 A1 Feb. 19, 2015

(30) Foreign Application Priority Data

Aug. 16, 2013 (TW) .............................. 102129575 U

(51) Int. Cl.
*G11C 19/00* (2006.01)
*G11C 19/28* (2006.01)

(52) U.S. Cl.
CPC ........ *G11C 19/28* (2013.01); *G09G 2310/0286* (2013.01)

(58) Field of Classification Search
None
See application file for complete search history.

(56) References Cited

U.S. PATENT DOCUMENTS

| 8,515,000 B2* | 8/2013 | Yang | G11C 19/28 377/64 |
|---|---|---|---|
| 2014/0010341 A1* | 1/2014 | Wu | G11C 19/00 377/78 |
| 2014/0168044 A1* | 6/2014 | Hu | G09G 3/3696 345/90 |
| 2014/0168048 A1* | 6/2014 | Shao | G09G 3/3677 345/100 |
| 2014/0355732 A1* | 12/2014 | Lin | G11C 19/28 377/64 |
| 2014/0369457 A1* | 12/2014 | Lin | G11C 19/28 377/64 |

\* cited by examiner

*Primary Examiner* — Tuan T Lam
(74) *Attorney, Agent, or Firm* — McClure, Qualey & Rodack, LLP

(57) ABSTRACT

A shift register circuit includes first-type and second-type shift registers, each comprising a pull-down control circuit, a pull-down circuit, a key pull-down circuit, a 3D-mode pull-up circuit, and a 2D-mode pull-up circuit. The pull-down circuit is connected to the pull-down control circuit. The key pull-down circuit, connected to the pull-down circuit, pulls down a driving signal and a gate control signal. When the 2D-mode pull-up circuit operates, a first-type shift register generates a driving signal for a second-type shift register. When the 3D-mode pull-up circuit operates, a first-type shift register generates another driving signal for another first-type shift register.

18 Claims, 7 Drawing Sheets

SHIFT REGISTER CIRCUIT

CROSS-REFERENCE TO RELATED APPLICATIONS

This non-provisional application claims priority under 35 U.S.C. §119(a) on Patent Application No. 102129575 filed in Taiwan, R.O.C. on Aug. 16, 2013, the entire contents of which are hereby incorporated by reference.

TECHNICAL FIELD

This disclosure relates to a shift register applicable in a display device, particularly to a shift register applicable in a display device and adaptable to a variety of display modes.

BACKGROUND

As the technological advancement in the display panel industry becomes more demanding on display quality, it also moves towards reducing the size of panels. It is also desirable that the manufacturing cost can be as low as possible while achieving the same functionality in the product. Technology constantly evolves to meet these needs. To generate gate pulse signals and data pulse signals, the industry typically employs external driver integrated circuits, which are an extra step in the production process and a waste of resources. An engineering bypass would be incorporating, during manufacture, the shift register of the gate driver integrated circuit straight onto the glass panel, a technique often known as gate-driver-on-array (GOA).

Displays tend to become more versatile. Not only do manufacturers pursue higher scan rates, they also wish that two-dimension (2D) and three-dimension (3D) modes are interoperable on the same panel. The circuitry has to be modified accordingly. For instance, a common display may only scan at a rate of 60 Hz, serviceable only in 2D mode, as shown in FIG. 1, where the next adjacent scan line is driven. The same conventional display circuit, which drives the next adjacent scan line, would not be applicable in 3D mode because the first-stage output and the second-stage output are of the same phase (see FIG. 2).

To employ such circuitry in 3D mode, three high-frequency signal widths of drift time might exist for a 60-Hz operating frequency, inviting electrical leakage or other signal interference. In other words, the driver circuit drives the next adjacent scan line once every period when the display operates in 2D mode, but in 3D mode the driver circuit has to idle for three periods to drive the fourth next scan line, rendering the output signal floating, unstable, and vulnerable to interference in a 60-Hz frame rate.

SUMMARY

The present invention discloses a shift register circuit, which includes a first first-type shift register and a first second-type shift register. The first first-type shift register, driven by a first driving signal, outputs a first gate control signal. The first first-type shift register comprises a first pull-down control circuit, a first pull-down circuit, a first key pull-down circuit, a first 3D-mode pull-up circuit, and a first 2D-mode pull-up circuit. The first pull-down circuit is electrically connected to the first pull-down control circuit. The first key pull-down circuit, electrically connected to the first pull-down circuit, pulls down the first driving signal and the first gate control signal. The first 3D-mode pull-up circuit receives the first gate control signal, a first pulse signal, and a second pulse signal to generate another first driving signal. The first 2D-mode pull-up circuit receives the first gate control signal, the first pulse signal, and the second pulse signal to generate a second driving signal.

When the first 2D-mode pull-up circuit operates, the first first-type shift register generates the second driving signal for the first second-type shift register, enabling the first second-type shift register to generate a second gate control signal. The first first-type shift register corresponds to a first scan line, whereas the first second-type shift register corresponds to a second scan line.

The present invention discloses a shift register circuit, which includes a n-th shift register. The n-th shift register, driven by a n-th driving signal, outputs a n-th gate control signal. The n-th shift register comprises a first pull-down control circuit, a first pull-down circuit, a first key pull-down circuit, a first 3D-mode pull-up circuit, and a first 2D-mode pull-up circuit. The first pull-down circuit is electrically connected to the first pull-down control circuit. The first key pull-down circuit, electrically connected to the first pull-down circuit, pulls down the n-th driving signal and the n-th gate control signal. The first 3D-mode pull-up circuit receives the n-th gate control signal, a n-th pulse signal, and a (n+1)-th pulse signal to generate another n-th driving signal of the n-th shift register. The first 2D-mode pull-up circuit receives the n-th gate control signal, the n-th pulse signal, and the (n+1)-th pulse signal to generate a (n+1)-th driving signal.

When the first 2D-mode pull-up circuit operates, the n-th shift register generates the (n+1)-th driving signal for a (n+1)-th shift register of the shift register circuit, enabling the (n+1)-th shift register to generate a (n+1)-th gate control signal. The n-th shift register corresponds to a n-th scan line, whereas the (n+1)-th shift register corresponds to a (n+1)-th scan line, n being a positive odd number.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 3:
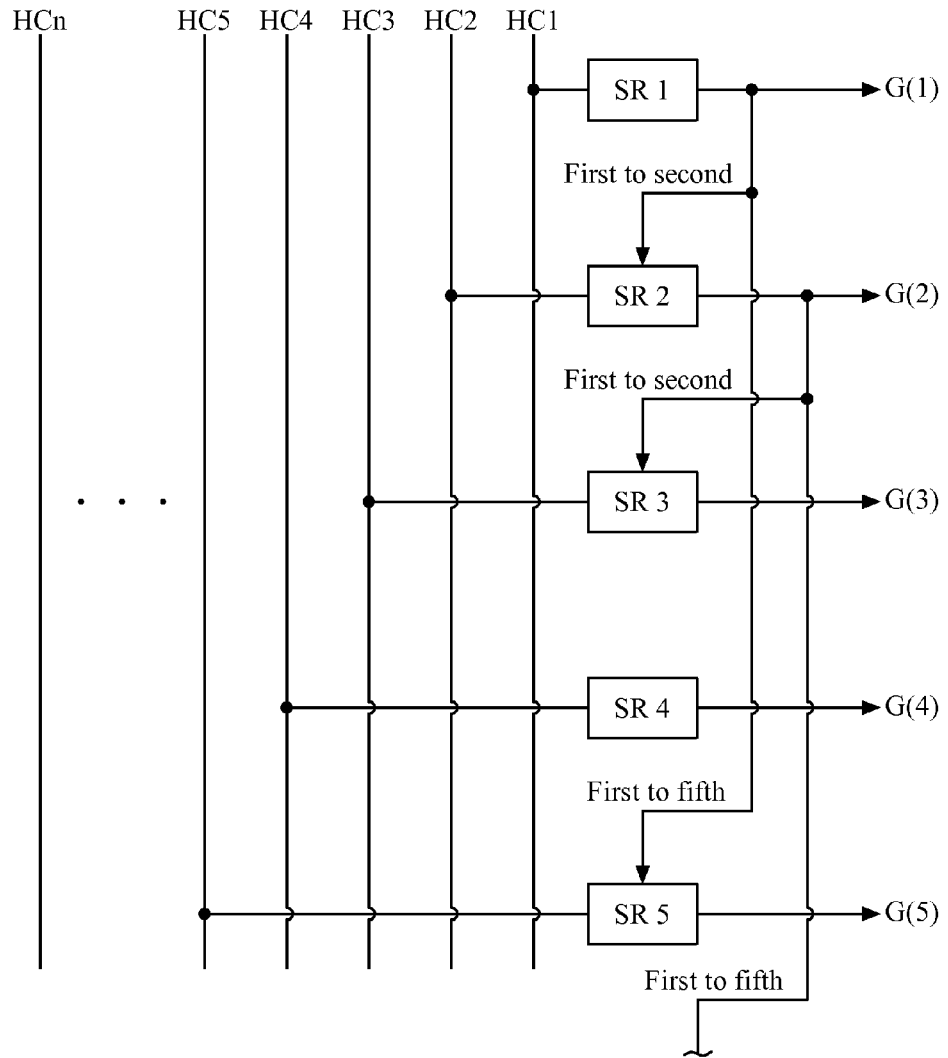
FIG. 3 is an architectural diagram of a shift register circuit, in accordance with an embodiment of the present invention.

The present invention provides a shift register adaptable to different operating modes of a shift register circuit. FIG. 3 is an architectural diagram of the shift register circuit disclosed by the present invention. In FIG. 3, shift register one SR1 may be the aforementioned first first-type shift register, shift register two SR2 may be the first second-type shift register, and so on. Shift register one SR1 receives a first pulse signal HC1 to generate a first gate control signal G(1). Shift register two SR2 receives a second pulse signal HC2 to generate a second gate control signal G(2). When the shift register circuit operates in two-dimension (2D) mode, the first gate control signal G(1) is received by shift register two SR2, and the second gate control signal G(2) by shift register three SR3. When the shift register circuit operates in three-dimension (3D) mode, the first gate control signal G(1) is instead received by shift register five SR5.

By connecting high-frequency pulse signals, the present invention is capable of adapting to different operating modes to achieve better gate control signal output, and avoiding driving signal leakage or interference by other signals.

Figure 4:
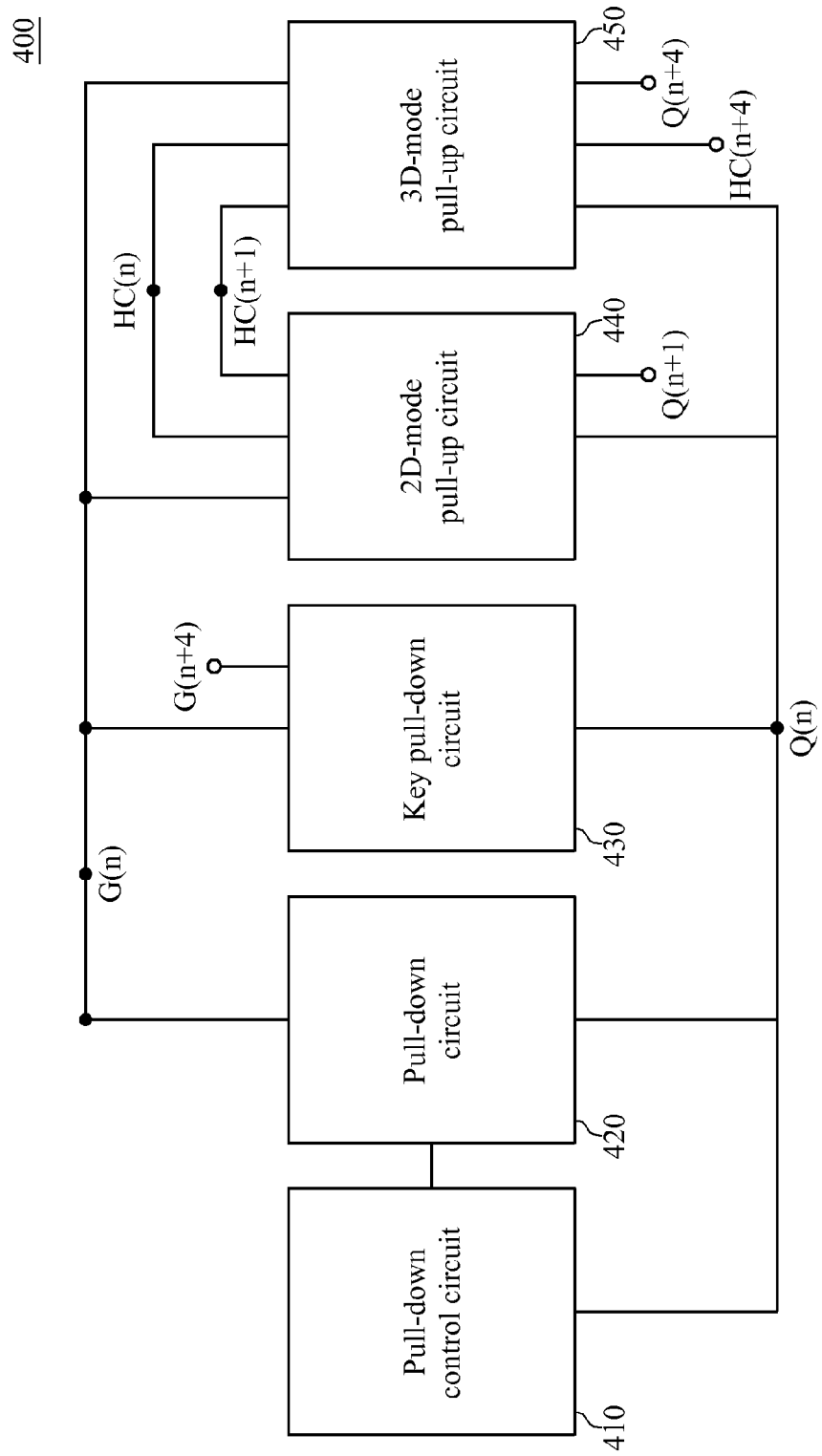
FIG. 4 is a block diagram of a shift register, in accordance with an embodiment of the present invention.

FIG. 4 is a block diagram of the shift register 400, in accordance with an embodiment of the present invention. The shift register 400 comprises a pull-down control circuit 410, a pull-down circuit 420, a key pull-down circuit 430, a 2D-mode pull-up circuit 440, and a 3D-mode pull-up circuit 450.

The shift register 400 may be the first first-type shift register or the first shift register; in other words, n=1 in the example of FIG. 4. The 3D-mode pull-up circuit 450 receives a first driving signal Q(n), a first pulse signal HC(n), a second pulse signal HC(n+1), a fifth pulse signal HC(n+4), and the first gate control signal G(n) to output a fifth driving signal Q(n+4). The 2D-mode pull-up circuit 440 receives the first driving signal Q(n), the first pulse signal HC(n), the second pulse signal HC(n+1), and the first gate control signal G(n) to output a second driving signal Q(n+1). The pull-down control circuit 410, the pull-down circuit 420, and the key pull-down circuit 430 are all electrically connected to the first driving signal Q(n). The pull-down circuit 420 and the key pull-down circuit 430 are both electrically connected to the first gate control signal G(n).

When the first pulse signal HC(n) and the second pulse signal HC(n+1) are both on a first signal level, the 3D-mode pull-up circuit 450 is activated to generate the fifth driving signal Q(n+4), while the 2D-mode pull-up circuit 440 is deactivated. In practice, the said fifth driving signal Q(n+4) is another first driving signal. When the first pulse signal HC(n) and the second pulse signal HC(n+1) are not both on the first signal level, the 2D-mode pull-up circuit 440 is activated to generate the second driving signal Q(n+1), while the 3D-mode pull-up circuit 450 is deactivated. When the key pull-down circuit 430 receives a fifth gate control signal G(n+4), the first driving signal Q(n) and the first gate control signal G(n) are pulled down.

In the following embodiments of the shift register circuit, each switch component therein is a transistor for performing relevant circuit functions.

Figure 5:
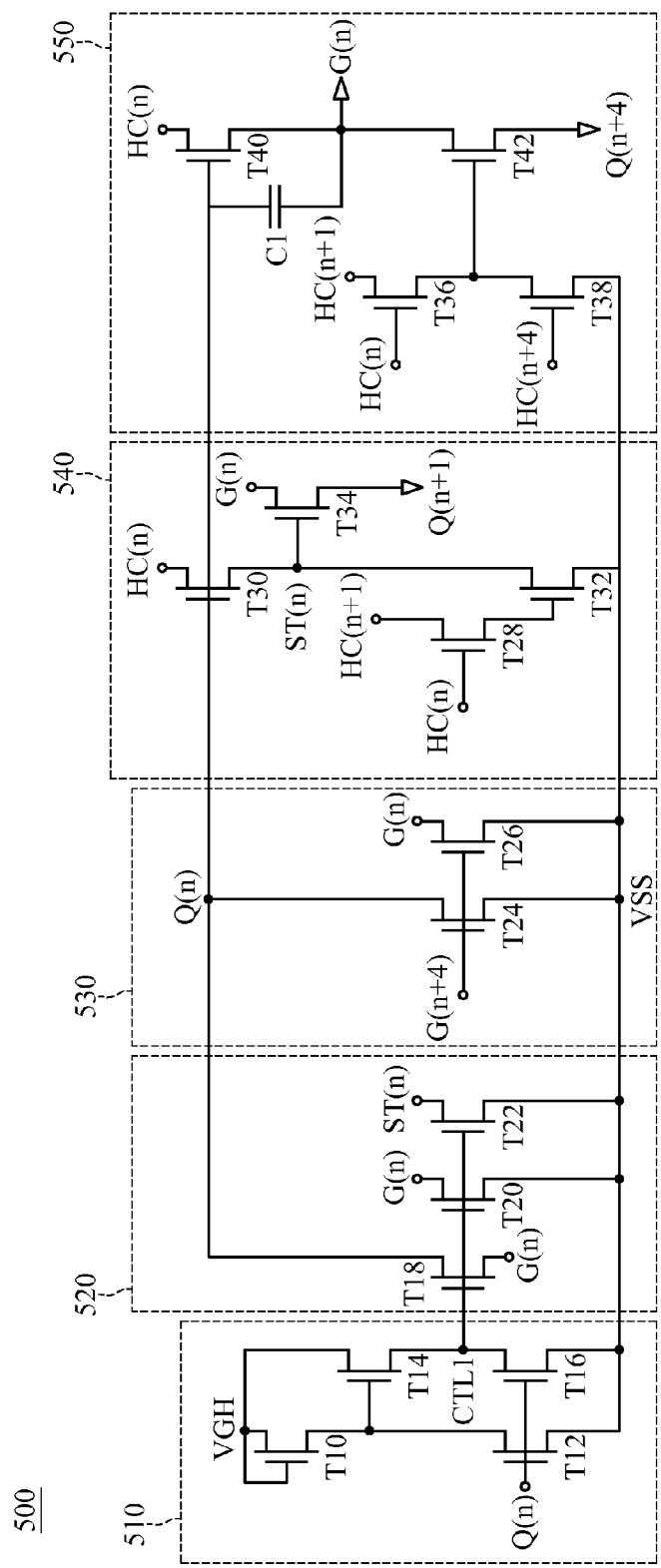
FIG. 5 is a detailed circuit diagram of a first-type shift register, in accordance with an embodiment of the present invention.

FIG. 5 is a detailed circuit diagram of the first-type shift register 500, in accordance with an embodiment of the present invention. Assume that the first-type shift register 500 is a n-th-stage shift register. The first-type shift register 500 elects to output the driving signal Q(n+1) for the (n+1)-th-stage shift register or the driving signal Q(n+4) for the (n+4)-th-stage shift register, depending on whether the first pulse signal HC(n) and the second pulse signal HC(n+1) are both on the first signal level. The first-type shift register 500 of the present invention is basically an odd-number-stage shift register; in other words, n is a positive odd number.

The first-type shift register 500 comprises a first pull-down control circuit 510, a first pull-down circuit 520, a first key pull-down circuit 530, a first 2D-mode pull-up circuit 540, and a first 3D-mode pull-up circuit 550. The first pull-down control circuit 510 receives the first driving signal Q(n) and controls the operation of the first pull-down circuit 520. The first voltage node VGH is for receiving power supply signal. In one embodiment, when the first pull-down circuit 520 receives a first control signal CTL1 from the first pull-down control circuit 510, it performs a pull-down action to lower the surge voltage level of the first driving signal Q(n), the first gate control signal G(n), and the first signal node ST(n).

The first pull-down control circuit 510 in FIG. 5 further comprises a first transistor T10, a second transistor T12, a third transistor T14, and a fourth transistor T16. The gate of the first transistor T10 is electrically connected to the drain of the first transistor T10, the drain of the third transistor T14, and the first voltage node VGH. The source of the first transistor T10 is electrically connected to the drain of the second transistor T12 and the gate of the third transistor T14. The source of the third transistor T14 is electrically connected to the drain of the fourth transistor T16 and the gate of the fifth transistor T18, which is of the first pull-down circuit 520. The gates of the second transistor T12 and the fourth transistor T16 are both electrically connected to the first driving signal Q(n). Furthermore, the sources of the second transistor T12 and the fourth transistor T16 are both electrically connected to the second voltage node VSS. The first transistor T10 and the third transistor T14 are used as a resistor. The second transistor T12 and the fourth transistor T16 receive the first driving signal Q(n) to generate the first control signal CLT1.

The first pull-down circuit 520 comprises a fifth transistor T18, a sixth transistor T20, and a seventh transistor T22. Of the fifth transistor T18, the gate connects with the first control signal CLT1, the source is electrically connected to the first gate control signal G(n), and the drain is electrically connected to the first driving signal Q(n). Of the sixth transistor T20, the gate is electrically connected to the first control signal CLT1, the source to the second voltage node VSS, and the drain to the first gate control signal G(n). Of the seventh transistor T22, the gate is electrically connected to the first control signal CLT1, the source to second voltage node VSS, and the drain to the first signal node ST(n).

The first key pull-down circuit 530 comprises an eighth transistor T24 and a ninth transistor T26. The gate of the eighth transistor T24 is electrically connected to the gate of the ninth transistor T26 and the fifth gate control signal G(n+4). The source of the eighth transistor T24 is electrically connected to the source of the ninth transistor T26 and the second voltage node VSS. The drain of the eighth transistor T24 is electrically connected to the first driving signal Q(n), whereas that of the ninth transistor T26 is electrically connected to the first gate control signal G(n). The eighth transistor T24 and the ninth transistor T26 receives the fifth gate control signal G(n+4) for pulling down the first driving signal Q(n) and the first gate control signal G(n).

The first 2D-mode pull-up circuit 540 comprises a tenth transistor T28, an eleventh transistor T30, a twelfth transistor T32, and a thirteenth transistor T34. Of the tenth transistor T28, the gate is electrically connected to the first pulse signal HC(n), the drain to the second pulse signal HC(n+1), and the source to the gate of the twelfth transistor T32. Of the eleventh transistor T30, the gate is electrically connected to the first driving signal Q(n), the drain to the first pulse signal HC(n), and the source to the gate of the thirteenth transistor T34, the drain of the twelfth transistor T32, and the first signal node ST(n). The source of the twelfth transistor T32 is electrically connected to the second voltage node VSS. Of the thirteenth transistor T34, the drain is electrically connected to the first gate control signal G(n), and the source to the second driving signal Q(n+1). The tenth transistor T28, the eleventh transistor T30, and the twelfth transistor T32 receive the first pulse signal HC(n), the second pulse signal HC(n+1), and the first driving signal Q(n) to turn on the thirteenth transistor T34.

The first 3D-mode pull-up circuit 550 comprises a fourteenth transistor T36, a fifteenth transistor T38, a sixteenth transistor T40, a seventeenth transistor T42, and a first coupling capacitor C1. Of the fourteenth transistor T36, the gate is electrically connected to the first pulse signal HC(n), the drain to the second pulse signal HC(n+1), and the source to the drain of the fifteenth transistor T38 and the gate of the seventeenth transistor T4. Of the fifteenth transistor T38, the gate is electrically connected to the fifth pulse signal HC(n+4), and the source to the second voltage node VSS. Of the sixteenth transistor T40, the drain is electrically connected to the first pulse signal HC(n), the gate to a first end of the first coupling capacitor C1 and the first driving signal Q(n), and the source to a second end of the first coupling capacitor C1, the first gate control signal G(n), and the drain of the seventeenth transistor T42. The source of the seventeenth transistor T42 is electrically connected to the fifth driving signal Q(n+4). The fourteenth transistor T36, the fifteenth transistor T38, and the seventeenth transistor T42 receives the first pulse signal HC(n), the second pulse signal HC(n+1), the fifth pulse signal HC(n+4), and the first gate control signal G(n) to generate the fifth driving signal Q(n+4). The sixteenth transistor T40 and the first coupling capacitor C1 receives the first pulse signal HC(n) and the first driving signal Q(n) to generate the first gate control signal G(n). The first coupling capacitor C1 has the function of signal adjusting and stabilizing.

Figure 6:
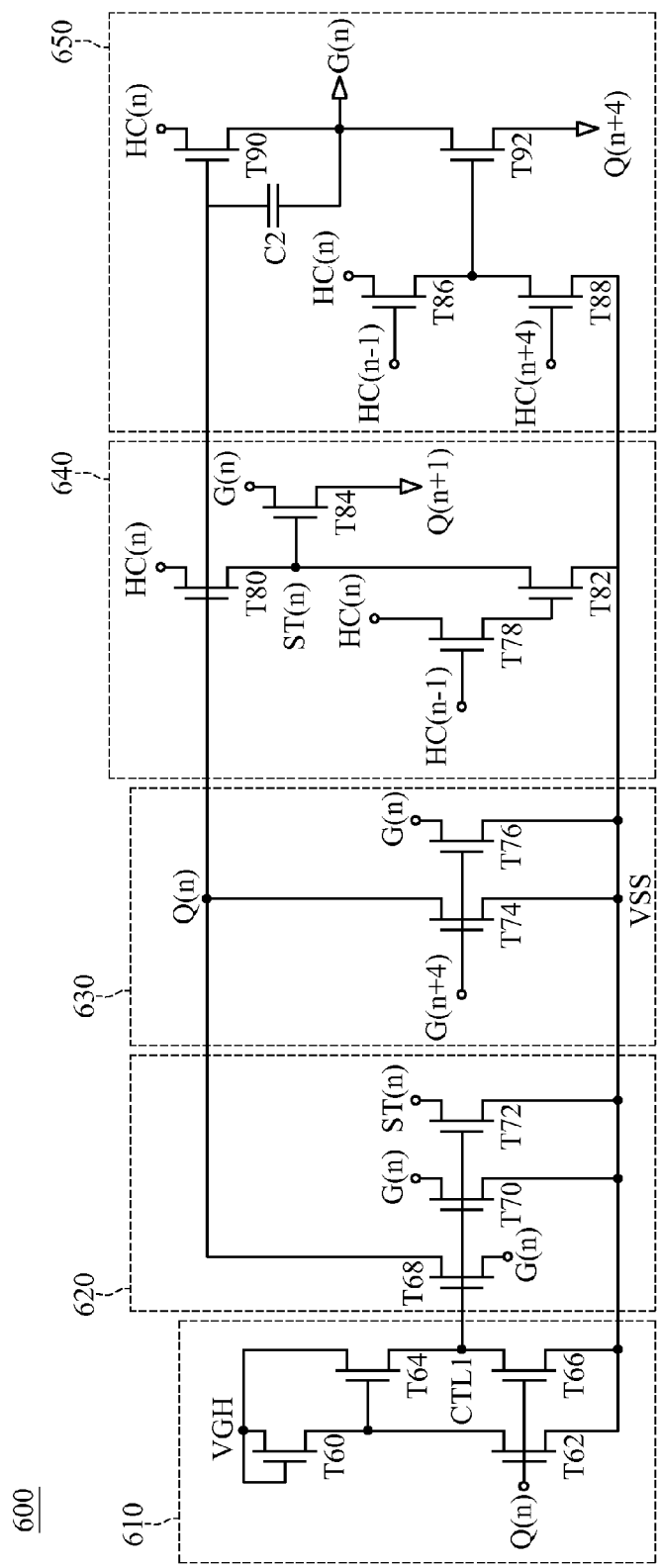
FIG. 6 is a detailed circuit diagram of a second-type shift register, in accordance with an embodiment of the present invention.

FIG. 6 is a detailed circuit diagram of the second-type shift register 600, in accordance with an embodiment of the present invention. As opposed to the first-type shift register 500, the second-type shift register 600 is basically an even-number-stage shift register. In other words, n is assumed to be a positive even number in the following descriptions of the second-type shift register 600. Assume that the second-type shift register 600 is a n-th-stage shift register circuit. The second-type shift register 600 elects to output the driving signal Q(n+1) for the (n+1)-th-stage shift register or the driving signal Q(n+4) for the (n+4)-th-stage shift register, depending on whether the received pulse signals HC(n) and HC(n−1) are both on the first signal level. Because the pulse signals HC(n) has different relationships with HC(n−1) or HC(n+1) in 2D and 3D modes, the shift registers 500 and 600 may output different driving signals Q(n+1) or Q(n+4) for different operating modes of the shift register circuit based on signal levels of the received pulse signals.

The second-type shift register 600 comprises a second pull-down control circuit 610, a second pull-down circuit 620, a second key pull-down circuit 630, a second 2D-mode pull-up circuit 640, and a second 3D-mode pull-up circuit 650. The second pull-down control circuit 610 receives the first driving signal Q(n) and controls the operation of the second pull-down circuit 620. The first voltage node VGH is for receiving power supply signal. The second pull-down circuit 620 is also electrically connected to the first signal node ST(n). When the second pull-down circuit 620 receives a first control signal CTL1 from the second pull-down control circuit 610, it performs a pull-down action to lower the surge voltage level of the first driving signal Q(n), the first gate control signal G(n), and the first signal node ST(n).

The second pull-down control circuit 610 further comprises a twenty-first transistor T60, a twenty-second transistor T62, a twenty-third transistor T64, and a twenty-fourth transistor T66. The gate of the twenty-first transistor T60 is electrically connected to the drain of the twenty-first transistor T60, the drain of the twenty-third transistor T64, and the first voltage node VGH. The source of the twenty-first transistor T60 is electrically connected to the drain of the twenty-second transistor T62 and the gate of the twenty-third transistor T64. The source of the twenty-third transistor T64 is electrically connected to the drain of the twenty-fourth transistor T66 and the gate of the twenty-fifth transistor T68, which is of the second pull-down circuit 620. The gates of the twenty-second transistor T62 and the twenty-fourth transistor T66 are both electrically connected to the first driving signal Q(n). Furthermore, the sources of the twenty-second transistor T62 and the twenty-fourth transistor T66 are both electrically connected to the second voltage node VSS. The twenty-first transistor T60 and the twenty-third transistor T64 are used as a resistor. The twenty-second transistor T62 and the twenty-fourth transistor T66 receive the first driving signal Q(n) to generate the first control signal CLT1.

The second pull-down circuit 620 comprises a twenty-fifth transistor T68, a twenty-sixth transistor T70, and a twenty-seventh transistor T72. Of the twenty-fifth transistor T68, the gate is electrically connected to the first control signal CLT1, the source to the first gate control signal G(n), and the drain to the first driving signal Q(n). Of the twenty-sixth transistor T70, the gate is electrically connected to the first control signal CLT1, the source to the second voltage node VSS, and the drain to the first gate control signal G(n). Of the twenty-seventh transistor T72, the gate is electrically connected to the first control signal CLT1, the source to second voltage node VSS, and the drain to the first signal node ST(n).

The second key pull-down circuit 630 comprises a twenty-eighth transistor T74 and a twenty-ninth transistor T76. The gate of the twenty-eighth transistor T74 is electrically connected to the gate of the twenty-ninth transistor T76 and the fifth gate control signal G(n+4). The source of the twenty-eighth transistor T74 is electrically connected to the source of the twenty-ninth transistor T76 and the second voltage node VSS. The drain of the twenty-eighth transistor T74 is electrically connected to the first driving signal Q(n), whereas that of the twenty-ninth transistor T76 is electrically connected to the first gate control signal G(n). The twenty-eighth transistor T74 and the twenty-ninth transistor T76 receives the fifth gate control signal G(n+4) for pulling down the first driving signal Q(n) and the first gate control signal G(n).

The second 2D-mode pull-up circuit 640 comprises a thirtieth transistor T78, a thirty-first transistor T80, a thirty-second transistor T82, and a thirty-third transistor T84. Of the thirtieth transistor T78, the gate is electrically connected to another pulse signal HC(n−1), the drain to the pulse signal HC(n), and the source to the gate of the thirty-second transistor T82. Of the thirty-first transistor T80, the gate is electrically connected to the first driving signal Q(n), the drain to the pulse signal HC(n), and the source to the gate of the thirty-third transistor T84, the drain of the thirty-second transistor T82, and the first signal node ST(n). The source of the thirty-second transistor T82 is electrically connected to the second voltage node VSS. Of the thirty-third transistor T84, the drain is electrically connected to the first gate control signal G(n), and the source to the second driving signal Q(n+1). The thirtieth transistor T78, the thirty-first transistor T80, and the thirty-second transistor T82 receive the pulse signal HC(n), the other pulse signal HC(n−1), and the first driving signal Q(n) to activate the thirty-third transistor T84. Due to the fact that n is a positive even number in the embodiment of FIG. 6, HC(n) and HC(n−1) may correspond to the second and the first pulse signals in the embodiment of FIG. 5, respectively. To avoid confusion, HC(n) is not called the first pulse signal in FIG. 6.

The second 3D-mode pull-up circuit 650 comprises a thirty-fourth transistor T86, a thirty-fifth transistor T8, a thirty-sixth transistor T90, a thirty-seventh transistor T92, and a second coupling capacitor C2. Of the thirty-fourth transistor T86, the gate is electrically connected to the other pulse signal HC(n−1), the drain to the pulse signal HC(n), and the source to the drain of the thirty-fifth transistor T88 and the gate of the thirty-seventh transistor T92. Of the thirty-fifth transistor T88, the gate is electrically connected to the fifth pulse signal HC(n+4), and the source to the second voltage node VSS. Of the thirty-sixth transistor T90, the drain is electrically connected to the pulse signal HC(n), the gate to a first end of the second coupling capacitor C2 and the first driving signal Q(n), and the source to a second end of the second coupling capacitor C2, the first gate control signal G(n), and the drain of the thirty-seventh transistor T92. The source of the thirty-seventh transistor T92 is electrically connected to the fifth driving signal Q(n+4). The thirty-fourth transistor T86, the thirty-fifth transistor T88, and the thirty-seventh transistor T92 receives the pulse signal HC(n), the other pulse signal HC(n−1), the fifth pulse signal HC(n+4), and the first gate control signal G(n) to generate the fifth driving signal Q(n+4). The thirty-sixth transistor T90 and the second coupling capacitor C2 receives the pulse signal HC(n) and the first driving signal Q(n) to generate the first gate control signal G(n) through the thirty-seventh transistor T92. The second coupling capacitor C2 has the function of signal adjusting and stabilizing.

Figure 1:
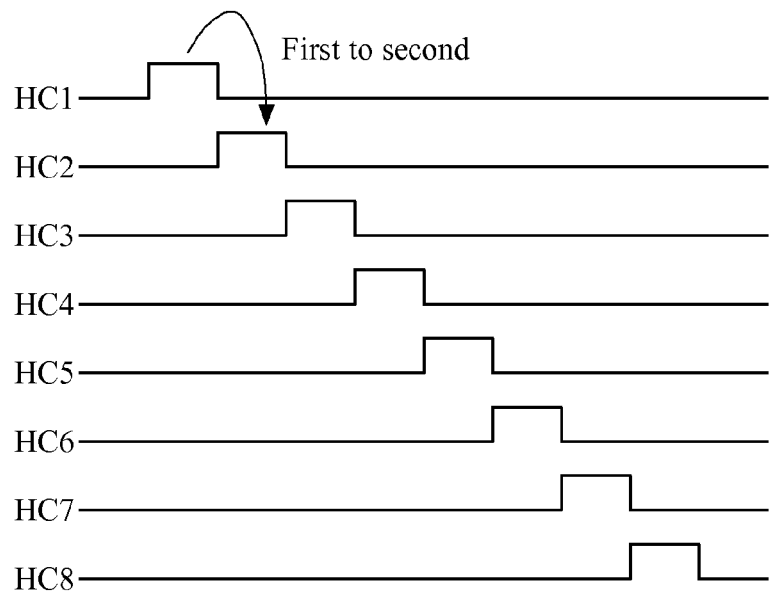
FIG. 1 is a timing diagram of operation in two-dimension mode.
Figure 2:
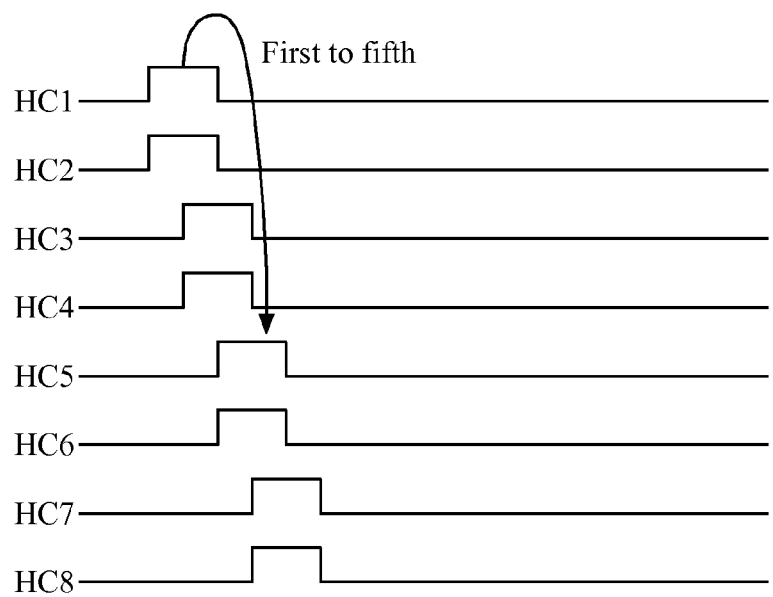
FIG. 2 is a timing diagram of operation in three-dimension mode.

When the shift register circuit operates in 2D mode, the pulse signals HC(n) and HC(n+1) do not overlap, as illustrated in FIG. 1, so the tenth transistor T28 and the twelfth transistor T32 are not turned on at the same time, and the thirteenth transistor T34 is activated to receive the first gate control signal G(n) to generate the second driving signal Q(n+1) for the shift register of the next stage. For example, the first first-type shift register sends the second driving signal Q(n+1) to the first second-type shift register.

When the first-type shift register 500 operates in 2D mode, the fourteenth transistor T36 of the first 3D-mode pull-up circuit 550 is off, and so is the seventeenth transistor T42. During this time the first 3D-mode pull-up circuit 550 does not operate. When the first-type shift register 500 operates in 3D mode, pulse signals HC(n) and HC(n+1) in FIG. 5 are in-phase, hence the tenth transistor T28 is turned on and so is the twelfth transistor T32. During this time the gate of the thirteenth transistor T34 is pulled down to a low level so that the thirteenth transistor T34 is not turned on; therefore, the first 2D-mode pull-up circuit 540 does not operate. In 3D mode, the fourteenth transistor T36 of the first 3D-mode pull-up circuit 550 is turned on, and so does the seventeenth transistor T42, causing the generation of the fifth driving signal Q(n+4). The generated fifth driving signal Q(n+4) is sent to the third first-type shift register (the fifth shift register within the whole shift register circuit).

Similarly, whether the second 2D-mode pull-up circuit 640 or the second 3D-mode pull-up circuit 650 of the second-type shift register 600 in FIG. 6 is activated depends on whether corresponding transistors are turned on. When the first-type shift register 500 in FIG. 5 is the first first-type shift register and the second-type shift register 600 in FIG. 6 is the first second-type shift register, they receive the same set of pulse signals; for example, they might both receive the first pulse signal and the second pulse signal. By the same reasoning, the second first-type shift register and the second second-type shift register are designed to receive the same set of pulse signals.

Figure 7:
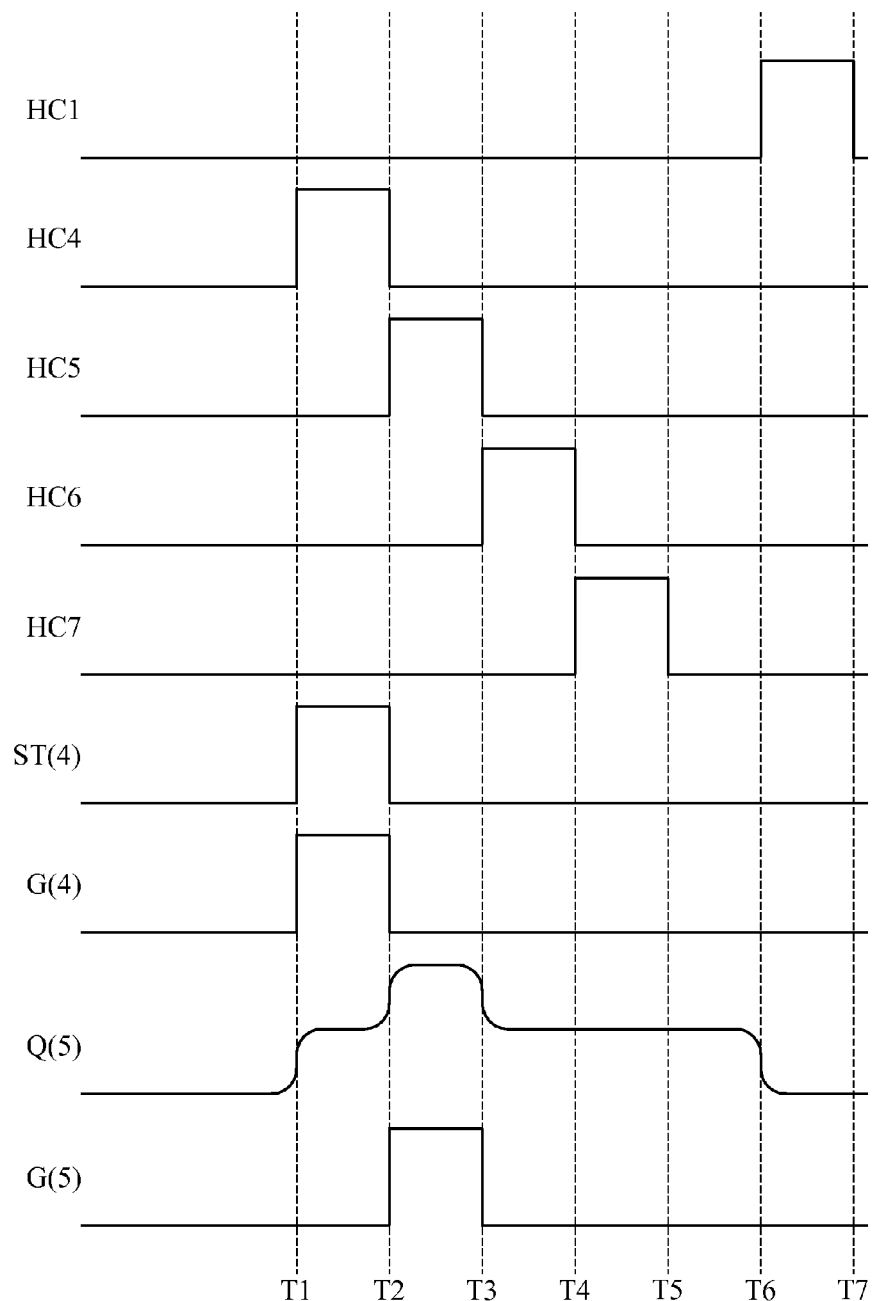
FIG. 7 is a timing diagram of a first first-type shift register operating in two-dimension mode, in accordance with an embodiment of the present invention.

FIG. 7 is a timing diagram of the first first-type shift register operating in 2D mode, in accordance with an embodiment of the present invention. In FIG. 7, the first pulse signal HC1, the second pulse signal HC2 (not shown), the third pulse signal HC3 (not shown), and so on, up to the seventh pulse signal HC7 are consecutive pulses and out-of-phase with each other. (Please note that the present invention does not limit the number of pulses. Those skilled in the art may employ any number of pulses based on their needs.) Referring to FIG. 5 and FIG. 7, since each pulse is out-of-phase with the next, the tenth transistor T28 and the twelfth transistor T32 cannot conduct at the same time, whereas the thirteenth transistor T34 conducts to receive the first gate control signal G(n) and generate the second driving signal Q(n+1) for the shift register of the next stage. During this time the first 2D-mode pull-up circuit 540 operates. In contrast, during this time the fourteenth transistor T36 is non-conducting and so is the seventeenth transistor T42; therefore, the first 3D-mode pull-up circuit 550 does not operate, leaving the first-type shift register 500 in 2D mode.

In FIG. 7, between times T1 and T2, when a shift register of the previous stage outputs a logic-high signal as the fifth driving signal Q(5) to the shift register of the current stage based on the fourth gate control signal G(4) and the fourth signal node ST(4), the fifth driving signal Q(5) of the shift register of the current stage is pre-charged to a logic level.

Then, between times T2 and T3, when the fifth pulse signal HC5 is logic high, both the fifth pulse signal HC5 and the first gate control signal G(1) (through the first coupling capacitor C1) is voltage-coupled with the fifth driving signal Q(5), pushing the fifth driving signal Q(5) to a higher logic level. Meanwhile, the shift register of the current stage outputs the fifth gate control signal G(5) based on the fifth driving signal Q(5) pushed to a higher logic level, in order to control the operation of the shift register of the current stage.

Figure 8:
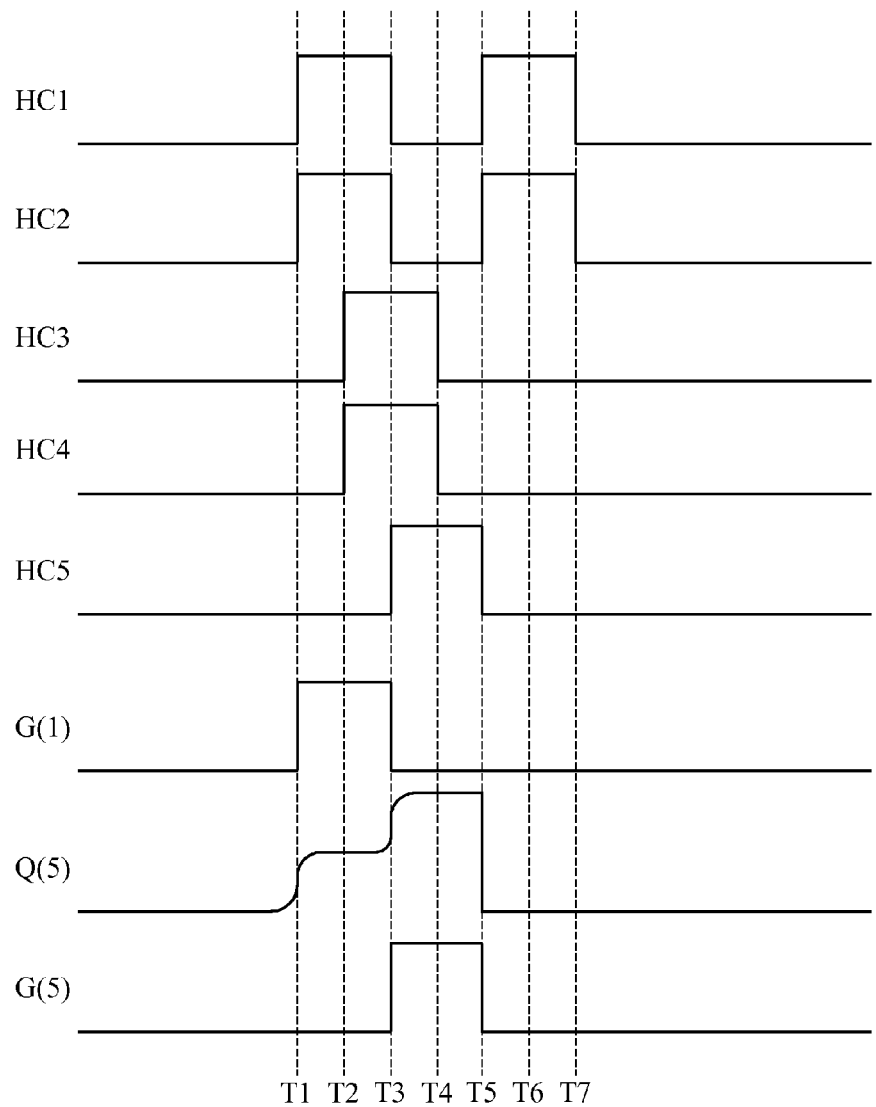
FIG. 8 is a timing diagram of a first first-type shift register operating in three-dimension mode, in accordance with an embodiment of the present invention.

FIG. 8 is a timing diagram of the first first-type shift register operating in 3D mode, in accordance with an embodiment of the present invention. In FIG. 8, the first pulse signal HC1 is in-phase with the second pulse signal HC2, the third pulse signal HC3 with the fourth pulse signal HC4, and so on. Again the present invention does not limit the number of pulses.

This embodiment is illustrated along with FIG. 5, where the first-type shift register 500 is assumed to be the first first-type shift register. In FIG. 8, between times T1 and T3, the tenth transistor T28 and the twelfth transistor T32 are turned on simultaneously, pulling down the level of the first signal node ST(n) to that of the second voltage node VSS. During this time the thirteenth transistor T34 does not conduct, so the 2D-mode pull-up circuit 540 does not operate. In FIG. 8, between times T1 and T3, the fourteenth transistor T36 of the first 3D-mode pull-up circuit 550 conducts, and so does the seventeenth transistor T42, to receive the first gate control signal G(n) and generate the fifth driving signal Q(n+4) for the shift register of the next stage. During this time the first-type shift register 500 operates in 3D mode.

In FIG. 8, between times T1 and T3, the shift register of the current stage (the first first-type shift register) pre-charges its fifth driving signal Q(5) to a logic level based on the first gate control signal G(1) output by the shift register of the previous stage. In this embodiment, the first 3D-mode pull-up circuit 550 of the first-type shift register 500 operates when input with in-phase pulses, with the fourteenth transistor T36 conducting. Between times T3 and T5 when the fifth pulse signal HC5 is logic high, the shift register of the current stage outputs the fifth gate control signal G(5) and pushes the fifth driving signal Q(5) to a higher logic level. Then, between times T5 and T6, the first key pull-down circuit 530 pulls down the fifth driving signal Q(5) to the level of the second voltage node VSS through the eighth transistor T24, ending the operation of the shift register of the current stage between times T1 and T6.

It should be noted that when the shift register of the present invention operates in 3D mode, that is, n is a positive odd number, first-type shift registers are chosen by the shift register circuit of the present invention to operate. When n is a positive even number, second-type shift registers are chosen by the shift register circuit of the present invention to operate. Therefore, the shift register circuit of the present invention is able to operate in 3D mode whether n is a positive odd number or a positive even number.

To summarize, the present invention discloses a shift register circuit applicable in display devices and adaptable to different display modes. By pairing pull-up circuits with pull-down circuits, the present invention may control the mode in which the circuit operates based on the interrelationship between high-frequency signals, modulating various delivery architectures and improving shift register circuit design. Better gate control signal output is achieved, and driving signal leakage and interference by other signals are avoided.

What is claimed is:

1. A shift register circuit including a first first-type shift register and a first second-type shift register, the first first-type shift register driven by a first driving signal to output a first gate control signal and comprising:
   a first pull-down control circuit;
   a first pull-down circuit electrically connected to the first pull-down control circuit;
   a first key pull-down circuit, electrically connected to the first pull-down circuit, for pulling down the first driving signal and the first gate control signal;
   a first 3D-mode pull-up circuit for receiving a first pulse signal, and a second pulse signal to generate another first driving signal and the first gate control signal; and
   a first 2D-mode pull-up circuit for receiving the first gate control signal, the first pulse signal, and the second pulse signal to generate a second driving signal;
   wherein when the first 2D-mode pull-up circuit operates, the first first-type shift register generates the second driving signal for the first second-type shift register, enabling the first second-type shift register to generate a second gate control signal;
   wherein the first first-type shift register corresponds to a first scan line, and the first second-type shift register corresponds to a second scan line.

2. The shift register circuit of claim 1, wherein the first second-type shift register comprises:
   a second pull-down control circuit;
   a second pull-down circuit electrically connected to the second pull-down control circuit;
   a second key pull-down circuit, electrically connected to the second pull-down circuit, for pulling down the second driving signal and the second gate control signal;
   a second 3D-mode pull-up circuit for receiving the first pulse signal, and the second pulse signal to generate an another first gate control signal and another first driving signal of the first second-type shift register; and
   a second 2D-mode pull-up circuit for receiving another first gate control signal, the first pulse signal, and the second pulse signal to generate another first driving signal of the first second-type shift register.

3. The shift register circuit of claim 2, wherein when the second 2D-mode pull-up circuit operates, the first second-type shift register generates a third driving signal for a second first-type shift register of the shift register circuit corresponding to a third scan line.

4. The shift register circuit of claim 3, wherein when the shift register circuit operates in a two-dimension mode, the second first-type shift register generates a fourth driving signal for a second second-type shift register of the shift register circuit corresponding to a fourth scan line.

5. The shift register circuit of claim 3, wherein when the first 3D-mode pull-up circuit operates, the first first-type shift register generates a fifth driving signal for a third first-type shift register of the shift register circuit corresponding to a fifth scan line.

6. The shift register circuit of claim 5, wherein when the shift register circuit operates in a three-dimension mode, the first second-type shift register generates a sixth driving signal for a third second-type shift register of the shift register circuit corresponding to a sixth scan line.

7. The shift register circuit of claim 2, wherein the second 3D-mode pull-up circuit includes a first transistor which receives the first pulse signal and the second pulse signal to electrically conduct when the shift register circuit operates in a three-dimension mode, activating the second 3D-mode pull-up circuit.

8. The shift register circuit of claim 7, wherein the first transistor electrically conducts when the first pulse signal and the second pulse signal are both on a first signal level.

9. The shift register circuit of claim 8, wherein the first signal level is logic high.

10. The shift register circuit of claim 2, wherein the second 2D-mode pull-up circuit includes a first transistor which receives the first pulse signal and the second pulse signal to electrically shut when the shift register circuit operates in a two-dimension mode, activating the second 2D-mode pull-up circuit.

11. The shift register circuit of claim 1, wherein the first 3D-mode pull-up circuit includes a first transistor which receives the first pulse signal and the second pulse signal to electrically conduct when the shift register circuit operates in a three-dimension mode, activating the first 3D-mode pull-up circuit.

12. The shift register circuit of claim 11, wherein the first transistor electrically conducts when the first pulse signal and the second pulse signal are both on a first signal level.

13. The shift register circuit of claim 12, wherein the first signal level is logic high.

14. The shift register circuit of claim 1, wherein the first 2D-mode pull-up circuit includes a first transistor which receives the first pulse signal and the second pulse signal to electrically shut when the shift register circuit operates in a two-dimension mode, activating the first 2D-mode pull-up circuit.

15. A shift register circuit including a n-th shift register and a (n+1)-th shift register, the n-th shift register driven by a n-th driving signal to output a n-th gate control signal and comprising:
   a first pull-down control circuit;
   a first pull-down circuit electrically connected to the first pull-down control circuit;

a first key pull-down circuit, electrically connected to the first pull-down circuit for pulling down the n-th driving signal and the n-th gate control signal;

a first 3D-mode pull-up circuit for receiving a n-th pulse signal, and a (n+1)-th pulse signal to generate the n-th gate control signal and an another n-th driving signal of the n-th shift register; and a first 2D-mode pull-up circuit for receiving the n-th gate control signal, the n-th pulse signal, and the (n+1)-th pulse signal to generate a (n+1)-th driving signal;

wherein when the first 2D-mode pull-up circuit operates, the n-th shift register generates the (n+1)-th driving signal for the (n+1)-th shift register, enabling the (n+1)-th shift register to generate a (n+1)-th gate control signal;

wherein the n-th shift register corresponds to a n-th scan line, and the (n+1)-th shift register corresponds to a (n+1)-th scan line;

wherein n is a positive odd number.

16. The shift register circuit of claim 15, wherein when the first 3D-mode pull-up circuit operates, the n-th shift register generates a (n+4)-th driving signal for a (n+4)-th shift register of the shift register circuit corresponding to a (n+4)-th scan line.

17. The shift register circuit of claim 15, further including a m-th shift register and a (m+1)-th shift register, the m-th shift register comprising:

a second pull-down control circuit;

a second pull-down circuit electrically connected to the second pull-down control circuit;

a second key pull-down circuit, electrically connected to the second pull-down circuit for pulling down a m-th driving signal and a m-th gate control signal;

a second 3D-mode pull-up circuit for receiving a (m−1)-th pulse signal, and a m-th pulse signal to generate the m-th gate control signal and an another m-th driving signal of the m-th shift register; and a second 2D-mode pull-up circuit for receiving the m-th gate control signal, the (m−1)-th pulse signal, and the m-th pulse signal to generate a (m+1)-th driving signal;

wherein when the second 2D-mode pull-up circuit operates, the m-th shift register generates the (m+1)-th driving signal for the (m+1)-th shift register, enabling the (m+1)-th shift register to generate a (m+1)-th gate control signal;

wherein the m-th shift register corresponds to a m-th scan line, and the (m+1)-th shift register corresponds to a (m+1)-th scan line;

wherein m is a positive even number.

18. The shift register circuit of claim 17, wherein when the second 3D-mode pull-up circuit operates, the m-th shift register generates a (m+4)-th driving signal for a (m+4)-th shift register of the shift register circuit corresponding to a (m+4)-th scan line.

* * * * *